United States Patent
Metras et al.

(10) Patent No.: US 10,937,778 B2
(45) Date of Patent: Mar. 2, 2021

(54) INTEGRATED CIRCUIT COMPRISING MACROS AND METHOD OF FABRICATING THE SAME

(71) Applicant: Commissariat à l'Énergie Atomique et aux Énergies Alternatives, Paris (FR)

(72) Inventors: Hughes Metras, Grenoble (FR);
Fabien Clermidy, Saint-Egreve (FR);
Didier Lattard, Grenoble (FR);
Sébastien Thuries, Grenoble (FR);
Pascal Vivet, Saint Paul de Varces (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 16/443,441

(22) Filed: Jun. 17, 2019

(65) Prior Publication Data
US 2019/0385995 A1    Dec. 19, 2019

(30) Foreign Application Priority Data

Jun. 18, 2018 (FR) ...................... 1855325

(51) Int. Cl.
*H01L 25/18* (2006.01)
*H01L 21/78* (2006.01)
(Continued)

(52) U.S. Cl.
CPC .............. *H01L 25/18* (2013.01); *H01L 21/78* (2013.01); *H01L 22/14* (2013.01); *H01L 24/08* (2013.01);
(Continued)

(58) Field of Classification Search
CPC ........... H01L 21/76802; H01L 23/5384; H01L 25/0652; H01L 24/19; H01L 24/81;
(Continued)

(56) References Cited

U.S. PATENT DOCUMENTS 4,799,009 A    1/1989 Tada et al.
6,271,542 B1    8/2001 Emma et al.
(Continued)

FOREIGN PATENT DOCUMENTS

EP    2 585 842 B1    5/2015
WO    WO 2008/100324 A2    8/2008
(Continued)

OTHER PUBLICATIONS

Preliminary Search Report for French Application No. 1855325, dated Jan. 24, 2019.
(Continued)

*Primary Examiner* — Brian Turner
(74) *Attorney, Agent, or Firm* — Wolf, Greenfield & Sacks, P.C.

(57) ABSTRACT

A tier of a 3D circuit comprising: one or more macro circuits, each macro circuit comprising a plurality of macro cells arranged in an array, the macro cells being separated from each other by spaces; and interconnection vias positioned in the spaces between the macro cells.

14 Claims, 4 Drawing Sheets

(51) Int. Cl.
| | |
|---|---|
| *H01L 21/66* | (2006.01) |
| *H01L 21/56* | (2006.01) |
| *H01L 23/50* | (2006.01) |
| *H01L 23/522* | (2006.01) |
| *H01L 23/00* | (2006.01) |
| *H01L 25/00* | (2006.01) |

(52) U.S. Cl.
CPC .............. *H01L 24/16* (2013.01); *H01L 25/50* (2013.01); *H01L 2224/08145* (2013.01); *H01L 2224/13025* (2013.01)

(58) Field of Classification Search
CPC ............. H01L 25/105; H01L 21/76877; H01L 23/3128; H01L 23/5389; H01L 24/20; H01L 21/76898; H01L 25/0657; H01L 25/50; H01L 23/481; H01L 24/92
See application file for complete search history.

(56) References Cited

U.S. PATENT DOCUMENTS

| | | | |
|---|---|---|---|
| 6,376,909 | B1 | 4/2002 | Forbes et al. |
| 6,465,892 | B1 | 10/2002 | Suga |
| 6,914,259 | B2 | 6/2005 | Sakiyama et al. |
| 7,863,733 | B2 | 1/2011 | Flautner et al. |
| 8,134,226 | B2 | 3/2012 | Hiroi et al. |
| 8,629,548 | B1 | 1/2014 | Andreev et al. |
| 9,214,449 | B2 | 12/2015 | Keeth |
| 9,236,864 | B1 | 1/2016 | Loh et al. |
| 9,666,562 | B2 | 5/2017 | Law et al. |
| 9,741,691 | B2 | 8/2017 | Lim et al. |
| 2001/0033030 | A1 | 10/2001 | Leedy |
| 2005/0127490 | A1 | 6/2005 | Black et al. |
| 2008/0150088 | A1 | 6/2008 | Reed et al. |
| 2008/0273361 | A1 | 11/2008 | Dudeck et al. |
| 2009/0111215 | A1 | 4/2009 | Caron et al. |
| 2010/0315853 | A1* | 12/2010 | Nomura .................. H01L 22/32 365/63 |
| 2011/0260318 | A1* | 10/2011 | Eisenstadt ............. G06F 30/392 257/737 |
| 2012/0146207 | A1* | 6/2012 | Chou .................. H01L 23/3675 257/690 |
| 2013/0091312 | A1* | 4/2013 | Ken ........................ G06F 13/42 710/106 |
| 2014/0377886 | A1 | 12/2014 | Koyanagi et al. |
| 2015/0355267 | A1* | 12/2015 | Pagani ................... H01L 22/34 324/62.01 |
| 2016/0042110 | A1 | 2/2016 | Lim et al. |
| 2016/0190101 | A1 | 6/2016 | Yu et al. |
| 2019/0019742 | A1* | 1/2019 | Lee .................. H01L 21/76898 |

FOREIGN PATENT DOCUMENTS

| | | |
|---|---|---|
| WO | WO 2010/068785 A1 | 6/2010 |
| WO | WO 2011/107612 A1 | 9/2011 |
| WO | WO 2015/153664 A1 | 10/2015 |

OTHER PUBLICATIONS

Jangam et al., Heterogeneous Fine-Pitch Integration Platform for Massively Scaled Systems-on-Wafer (SOW). Publicly available prior to Jun. 18, 2018, 4 pages.
Extended European Search Report for European Application No. 19180679.3, dated Aug. 14, 2019.
Black et al., Die Stacking (3D) Microarchitecture. 39th Annual IEEE/ACM International Symposium on Microarchitecture (MICRO'06). 2006:469-79.
England et al., Advanced packaging saves the day!—How TSV technology will enable continued scaling. In2017 IEEE International Electron Devices Meeting (IEDM). Dec. 2, 2017:1-4.
Fick et al., Centip3De: A 3930DMIPS/W Configurable Near-Threshold 3D Stacked System with 64 ARM Cortex-M3 Cores. 2012 IEEE International Solid-State Circuits Conference (ISSCC). 2012:190-2.
Hseih et al., A 3D Stacked Programmable Image Processing Engine in a 40 nm Logic Process with a Detector Array in a 45nm CMOS Image Sensor Technologies. Proceedings of the 2017 International Image Sensor Workshop, Hiroshima, Japan. May 30, 2017:4-7.
Keshavarzi et al., Directions in future of SRAM with QDR-WideIO for high performance networking applications and beyond. Proceedings of the IEEE 2014 Custom Integrated Circuits Conference. Sep. 15, 2014:1-6.
Kim et al., 3D-Maps: 3D Massively Parallel Processor with Stacked Memory. 2012 IEEE International Solid-State Circuits Conference (ISSCC). 2012:188-90.
Loh et al., 3D-Stacked Memory Architectures for Multi-Core Processors. IEEE International Symposium on Computer Architecture. 2008:453-64.
Puttaswamy et al., 3D-Integrated SRAM Components for High-Performance Microprocessors. IEEE Transactions on Computers. Oct. 2009;58(10):1369-81.
Sutardja et al., The Future of IC Design Innovation. 2015 IEEE International Solid-State Circuits Conference (ISSCC). 2015:16-21.
Tsai et al., Design Space Exploration for 3-D Cache. IEEE Transactions on Very Large Scale Integration (VLSI) Systems. Apr. 2008;16(4):444-55.

* cited by examiner

INTEGRATED CIRCUIT COMPRISING MACROS AND METHOD OF FABRICATING THE SAME

The present patent application claims priority from the French patent application filed on Jun. 18, 2018 and assigned application no. FR18/55325, the contents of which is hereby incorporated by reference.

FIELD

The present disclosure relates to the field of integrated circuits, and in particular to an integrated circuit comprising macros and logic cells and to a method of fabricating the same.

BACKGROUND

The fabrication process of integrated circuits involves various testing operations designed to identify and discard any defective chips. For example, a typical fabrication process for integrated circuits may result in a defect rate of around 0.1 defects per $in^2$ of silicon (equal to around 0.1 defects per 645 $mm^2$ of silicon).

The larger the surface area of an integrated circuit chip, the greater the risk of a defect being identified. A relatively low defect rate can therefore still lead to a high rate of discarded chips when the chip area is large. While it may be possible to repair certain types of defects, such interventions are generally time consuming and costly.

There is thus a need in the art for an integrated circuit, and a method of fabricating the same, that leads to a reduction in the discard rate, thereby providing a corresponding cost reduction with respect to current techniques.

SUMMARY

It is an aim of embodiments of the present description to at least partially address one or more needs in the prior art.

According to one aspect, there is provided a tier of a 3D circuit comprising: a stack formed of a semiconductor substrate, a transistor layer comprising transistors formed in and on the substrate, and a metal layer comprising metal levels insulated by a dielectric material, wherein one or more macro circuits are implemented in the stack, each macro circuit comprising a plurality of macro cells arranged in an array, the macro cells (202) being separated from each other by spaces; and interconnection vias positioned in the spaces between the macro cells, the interconnection vias extending through the substrate, through the transistor layer, and at least partially through the metal layer.

According to one embodiment, one or more of the interconnection vias extend through the metal layer to a corresponding interconnection pad formed on the surface of the metal layer for interconnecting with a second tier.

According to one embodiment, the interconnection vias are positioned at regular intervals.

According to one embodiment, the tier further comprises micro bumps positioned on one side of the substrate, each of the interconnection vias being connected to a corresponding one of the micro bumps.

According to one aspect, there is provided a tier of a 3D circuit comprising: one or more macro circuits, each macro circuit comprising a plurality of macro cells arranged in an array, the macro cells being separated from each other by spaces; and interconnection vias positioned in the spaces between the macro cells.

According to one embodiment, the tier comprises a stack formed of a substrate, a transistor layer and a metal layer, the interconnection vias extending at least partially through the substrate, through the transistor layer and to the metal layer.

According to one embodiment, the tier further comprises interconnection pads formed on the surface of the metal layer.

According to a further aspect, there is provided a 3D circuit comprising: a first tier comprising the above tier; and a second tier stacked on the first tier and comprising a logic circuit connected via interconnection pads to the one or more macro circuits of the first tier.

According to one embodiment, at least a first one of the interconnection vias is coupled to a supply voltage rail of the first tier for supplying a supply voltage to the first tier, and/or at least a second one of the interconnection vias is coupled to a supply voltage rail of the second tier for supplying a supply voltage to the second tier.

According to one embodiment, the 3D circuit further comprises micro bumps positioned on one side of the substrate and connected to the interconnection vias.

According to one embodiment, the logic circuit is connected to the interconnection vias of the first tier via metal connections formed in a metal layer of the first tier.

According to one embodiment, the first tier comprises transistors fabricated using a first transistor technology, and the second tier comprises transistors fabricated using a second transistor technology different to the first transistor technology.

According to a further aspect, there is provided a wafer comprising: a plurality of the above tiers arranged in columns and rows and separated by dicing lines.

According to one embodiment, each macro circuit comprises one or more test pads permitting the macro circuit to be tested.

According to a further aspect, there is provided a test system for testing the macro circuits of the above wafer, the test system comprising test equipment coupled to the one or more test pads via one or more test probes.

According to a further aspect, there is provided a method of fabricating a tier of a 3D circuit, the method comprising: forming one or more macro circuits, each macro circuit comprising a plurality of macro cells arranged in an array, the macro cells being separated from each other by spaces, the macro circuits being formed in a stack formed of a semiconductor substrate, a transistor layer comprising transistors formed in and on the substrate, and a metal layer comprising metal levels insulated by a dielectric material; and forming interconnection vias in the spaces between the macro cells, the interconnection vias extending through the substrate, through the transistor layer, and at least partially through the metal layer.

According to yet a further aspect, there is provided a method of fabricating a tier of a 3D circuit, the method comprising: forming one or more macro circuits, each macro circuit comprising a plurality of macro cells arranged in an array, the macro cells being separated from each other by spaces; and forming interconnection vias in the spaces between the macro cells.

According to one embodiment, forming the one or more macro circuits comprises forming a stack comprising a substrate, a transistor layer and a metal layer, the interconnection vias being formed such that they extend at least partially through the substrate, through the transistor layer and to the metal layer.

According to one embodiment, the method further comprises: forming one or more test pads on a surface of each macro circuit; and testing, using test equipment, each macro circuit via the one or more test pads to identify functional macro circuits.

According to one embodiment, the one or more macro circuits are formed on a wafer along with further macro circuits, the method further comprising: selecting the one or more macro circuits to form the tier of the 3D circuit from among the functional macro circuits; and performing dicing to separate the one or more macro circuits from the wafer.

According to a further aspect, there is provided a method of fabricating a 3D circuit, the method comprising: fabricating a first tier according to the above method; fabricating a second tier comprising a logic circuit; and stacking the second tier on the first tier.

BRIEF DESCRIPTION OF THE DRAWINGS

The foregoing and other features and advantages will become apparent from the following detailed description of embodiments, given by way of illustration and not limitation with reference to the accompanying drawings, in which.

It should be noted that the various views of integrated circuits in the various figures are not drawn to scale.

DETAILED DESCRIPTION

In following description, unless specified otherwise, the expressions "around", "approximately", "substantially" and "in the order of" signify within 10%, and preferably within 5%.

Figure 1:
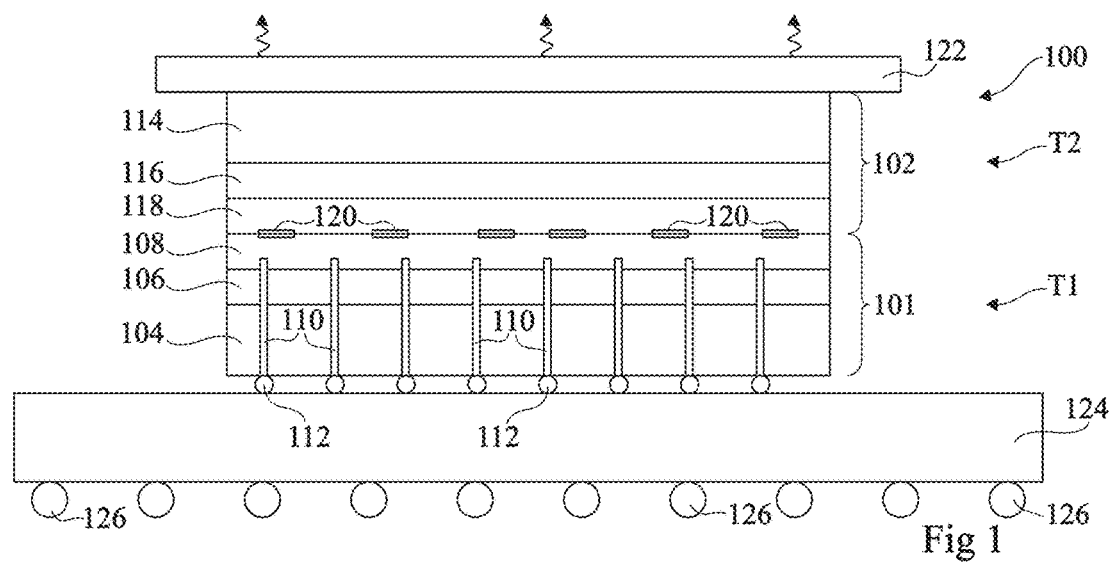
FIG. 1 is a cross-section view of a 3D circuit according to an example embodiment of the present disclosure.

FIG. 1 illustrates a 3D circuit 100 according to an example embodiment of the present disclosure. The 3D circuit 100 comprises two tiers T1 and T2 respectively corresponding to integrated circuit chips 101 and 102 stacked in a face-to-face arrangement. The "face" of an integrated circuit chip corresponds to the side closest to the metal interconnection levels, while the "back" corresponds to the side closest to the substrate, generally formed of silicon.

More generally, a 3D circuit is considered herein to be a circuit having any plurality of tiers stacked one upon the other, each tier having a transistor layer, in other words an active layer in which transistor devices are formed, and an interconnection layer in which interconnections between the transistor devices, and from the transistor devices to one or more other tiers, are formed.

The present inventors have noticed that in digital circuits or mixed digital/analog circuits, the surface area occupied by logic cells, i.e. standard cells, tends to correspond to up to 50 percent of the total surface area. The rest is occupied by larger macros, sometime referred to as IP (intellectual property) circuits. The 3D circuit 100 of FIG. 1 exploits this trend. In particular, the chip 101 for example corresponds to a macro tier, in which one or more macro circuits are implemented, while the chip of tier T2 for example corresponds to a logic tier, in which logic cells, or standard cells, are implemented. In some embodiments, the macro circuits and logic circuits of the circuit design may have non-equal surface requirements. In such a case, the tier T2 may additionally comprise one or more macros, and/or one or more of the macro circuits may be dummy circuits that are non-active and not used during the lifetime of the 3D circuit.

As known by those skilled in the art, logic cells are relatively small circuits comprising digital logic devices that are used to implement Boolean logic functions, such as AND, OR, NOR, XOR and XNOR gates, or basic storage functions, such as latches and flip-flips. These logic cells are generated by the circuit conception tool during a synthesis operation based on code defining the functionality of the logic cells, for example in the form of RTL (Register Transfer Level) code. Each logic cell is for example selected from a library of standard cells of the targeted technology.

As also known in the art, macros are generally larger circuits that may comprise logic cells and other circuitry including analog circuits. The design of a macro, including the positioning within the macro of the various cells of the macro and the interconnections between these cells, can be considered to be fixed, in other words it is not modified during the circuit synthesis and place and route operations.

In some embodiments, the same transistor technology can be used to fabricate the circuits 101 and 102. For example, both of the circuits 101 and 102 could be fabricated using the technology known to those skilled in the art as 28 nm FinFET technology. Alternatively, the circuits 101 and 102 could be fabricated using different technologies. For example, the logic circuit 102 could be fabricated using 28 nm FinFET technology, and the macro circuit 101 could be fabricated using 10 nm finFET technology in the case that the macros are SRAM memories, or the technology known in the art as relaxed node 65 nm technology in the case that the macros comprise analog devices.

The chip 101 for example comprises a substrate 104, for example formed of silicon or another semiconductor, a transistor layer 106 formed on the substrate 104 and for example comprising transistor gate stacks formed on the substrate 104, and a metal layer 108 formed on the transistor layer and comprising levels of metal interconnecting transistors of the transistor layer 106. For example, the metal layer comprises a layer of dielectric material in which levels of metal in defined patterns have been formed in order to provide connections between the transistors or other devices formed in the transistor layer.

A number of interconnection vias, such as TSVs (through silicon vias), 110 extend from the metal layer 108, through the transistor layer 106 and substrate 104, to an underside or backside of the chip 101, where they are for example connected to micro bumps 112.

The chip 102 for example comprises a substrate 114, for example formed of silicon or another semiconductor, a transistor layer 116 formed on the substrate 114 and for example comprising transistor gate stacks formed on the substrate 114, and a metal layer 118 formed on the transistor layer and comprising levels of metal interconnecting transistors of the transistor layer 116.

Interconnections 120, for example comprising copper-to-copper bonding pads, are formed between the metal layers 108 and 118 of the chips 101, 102. A heat spreader 122 is for example formed on the backside of the chip 102. The chip 101 is for example mounted on a package substrate 124 via the micro bumps 112. The package substrate 124 for example comprises connecting vias (not represented in FIG. 1) between the micro bumps 112 and BGA (Ball Grid Array) balls 126 positioned on an underside of the package substrate 124. The BGA balls 126 are for example used for electrically connecting the package to a circuit board (not illustrated).

An interface between the logic circuit of the chip 102 and the one or more macro circuits of the chip 101 is for example implemented by an RDL (redistribution layer), for example a hybrid bonding layer between the chips. For example, this layer comprises interconnection pads having a pitch of between 1 and 10 µm.

While in the example of FIG. 1 the interconnection vias 110 each extend to one or more metal levels in the metal layer 108, in some embodiments, one or more of the interconnection vias 110 extend to a corresponding interconnection pad 120 formed on the surface of the metal layer 108 for interconnecting with the tier T2.

The interconnection vias 110 are for example formed at regular intervals in spaces formed between macro circuits formed in the tier T1. In some embodiments, one or more of the interconnection vias is coupled to a supply voltage rail of the first tier for supplying a supply voltage, such as a VDD or GND voltage, to the first tier, and/or one or more of the interconnection vias is coupled to a supply voltage rail of the second tier for supplying a supply voltage, such as a VDD or GND voltage, to the second tier. An advantage of providing supply voltages to the tier T1 and/or tier T2 via regularly spaced interconnection vias is that they can be used to supply the voltage supply rails of the tiers, which are for example regularly spaced in the metal layers 108, 118 of the respective tiers. Advantageously, this permits either or both tiers to be supplied with relatively low IR (current resistance) drop.

Furthermore, while in the embodiment of FIG. 1 the tiers T1 and T2 are stacked face-to-face, in alternative embodiments, they could be stacked back-to-back, for example with the substrate 114 of the tier T2 contacting the metal layer 108 of the tier T1. In such a case, the tier T2 for example comprises interconnection vias extending from the interconnection pads 120, through the substrate 114 and transistor layer 116, to the metal layer 118 of the tier T2.

An advantage of the circuit 100 of FIG. 1 is that, by implementing a circuit using two separate chips, the surface area of each chip is considerably reduced, thereby reducing the probability of a defect being present on either chip following fabrication. By identifying and selecting only known good dies (KGDs) to be assembled to form the 3D circuit, the overall discard rate of the chips can be reduced, leading to a cost reduction.

Furthermore, the logic circuit of the chip 102 can be designed without the need of 3D interconnections traversing this layer. Thus the design overhead due to the 3D technology is relatively little as concerns the logic circuit. By placing the macros of the circuit in the chip 101, which is traversed by TSVs, a relatively simple design can be adopted that has an efficient use of surface area, as will now be described in more detail with reference to FIGS. 2 and 3.

Figure 2:
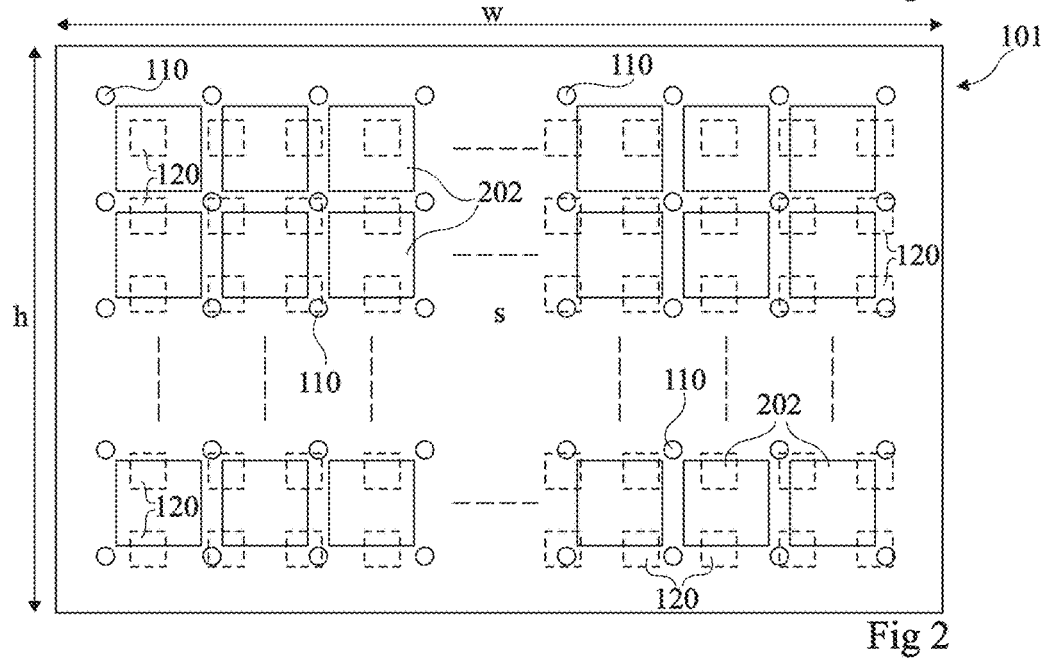
FIG. 2 is a plan view of a macro tier of the 3D circuit of FIG. 1 according to an example embodiment of the present disclosure.

FIG. 2 is a plan view of the chip 101 according to an example embodiment. As illustrated, the chip 101 for example comprises an array of macro cells 202. As will be described in more detail below with reference to FIGS. 8 and 9, in some embodiments these macro cells form one or more macro circuits.

Each macro cell 202 for example implements a memory array, such as an SRAM (Static Random Access Memory) array, although other types of macro cells could also be implemented, including other types of memories or register banks, data processors, or even analog circuits that can be implemented in a modular fashion. In the example of FIG. 2, each of the macro cells 202 has the same size, but in alternative embodiments, it would be possible to implement macro cells of different sizes.

The TSVs 110 are located in gaps between the macro cells 202, and for example at regular intervals. For example, the macro cells are square or rectangular in shape, and the TSVs 110 traverse the chip in the space separating adjacent corners of the macro cells 202. Other positions of the TSVs around the macro cells 202 would also be possible.

FIG. 2 also represents, using dashed squares, the interconnection pads 120 formed on top of the metal layers of the chip 101. For example, these pads 120 are formed in a hybrid bonding (HB) layer. These pads 120 are for example formed in an array having a regular pitch, the pitch for example being in the range 1 to 10 µm as mentioned above. For ease of illustration, the pads 120 in FIG. 2 are illustrated having a relatively high pitch.

An advantage of separating the logic cells of the design from the macro cells is that this facilitates the physical implementation of the design, including the floor planning, by removing physical constraints encountered when connections between logic cells must pass around intermediate macro cells. By forming the logic cells and macro cells on different layers, the connections between the logic cells, and between the logic cells and macro cells, can be short and thus provide rapid and efficient electrical connections.

A circuit conception method for generating a 3D circuit layout that could be used for designing the chip 102 is described in the patent application entitled "Conception of a 3D circuit comprising macros" having the same filing date and applicant as the present case (law firm reference B16909, applicant reference DD18558ST), the contents of which is hereby incorporated by reference. Indeed, that patent application describes generating a 3D circuit in which one tier comprises only macros and the other tier comprises a logic circuit, and optionally one or more macros. For example, the physical implementation of the 3D circuit of FIG. 1, involving synthesis and place and route, is based on timing and power files (for example .lib files) and physical abstract view files (for example .lef files) defining the macro circuits of the design. In some embodiments, a timing and power file (.lib file) is provided having added routing nets for reaching 3D contacts of the macro circuits, and a physical abstract view file (.lef file) is provided in which each macro circuit is encapsulated into the metal layer of the structure, and the position of the pins is defined. A designer can than base the physical implementation of the logic circuits on a model defined by these files and defining in particular the floorplan and pin positions of each macro circuit.

Figure 3:
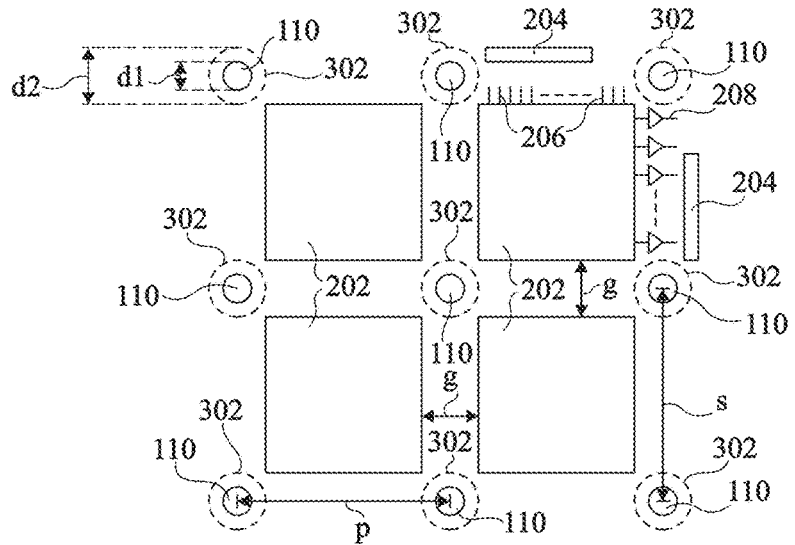
FIG. 3 is a plan view of several macro cells of the macro tier of FIG. 2 according to an example embodiment of the present disclosure.

FIG. 3 is a plan view showing four of the macro cells 202 of FIG. 2 in more detail. As illustrated, each TSV 110 is for example surrounded by an exclusion zone 302, which is for example circular, and represents a zone that cannot be covered by the macro cells 202. Each TSV 110 for example has a diameter d1 of between 3 and 10 µm, and for example of around 5 µm. The exclusion zones 302 for example have diameters d2 of between 5 and 20 µm, and for example of around 10 µm. In some embodiments, a macro cell 202 cannot cover a region within around 5 µm of a TSV. The pitch p of the TSVs, in other words the separation between adjacent TSVs, is for example between 50 and 500 µm, depending on the sizes of the macro cells, and may be different in the horizontal and vertical directions. The gap g between adjacent macro cells is for example equal to around the width of the keep out zones 302, and is for example around 15 µm. In one embodiment, the chip 101 has a surface area of between 100 $mm^2$ and 200 $mm^2$, and a width w and height h of between around 10 mm and 15 mm. The pitch p is for example equal to between 100 and 300 µm, and for example around 150 µm.

In some embodiments, one or more test circuits 204, which are for example built-in self-test (BIST) circuits, are formed in the chip 102 and associated with each macro cell 202. Alternatively, each BIST circuit could be shared by more than one macro cell 202. These BIST circuits permit the macro cells to be tested. For example, the BIST circuits 204 have access to one or more input pins 206 and one or more output pins 208 of each macro cell 202. In the case that the macro cells 202 implement memory circuits, the input pins 206 for example include clock, address and data pins, and the output pins 208 for example include data pins. For ease of illustration, examples of input and output pins 206, 208 are represented in FIG. 3 in relation with only one of the macro cells.

Figure 4:
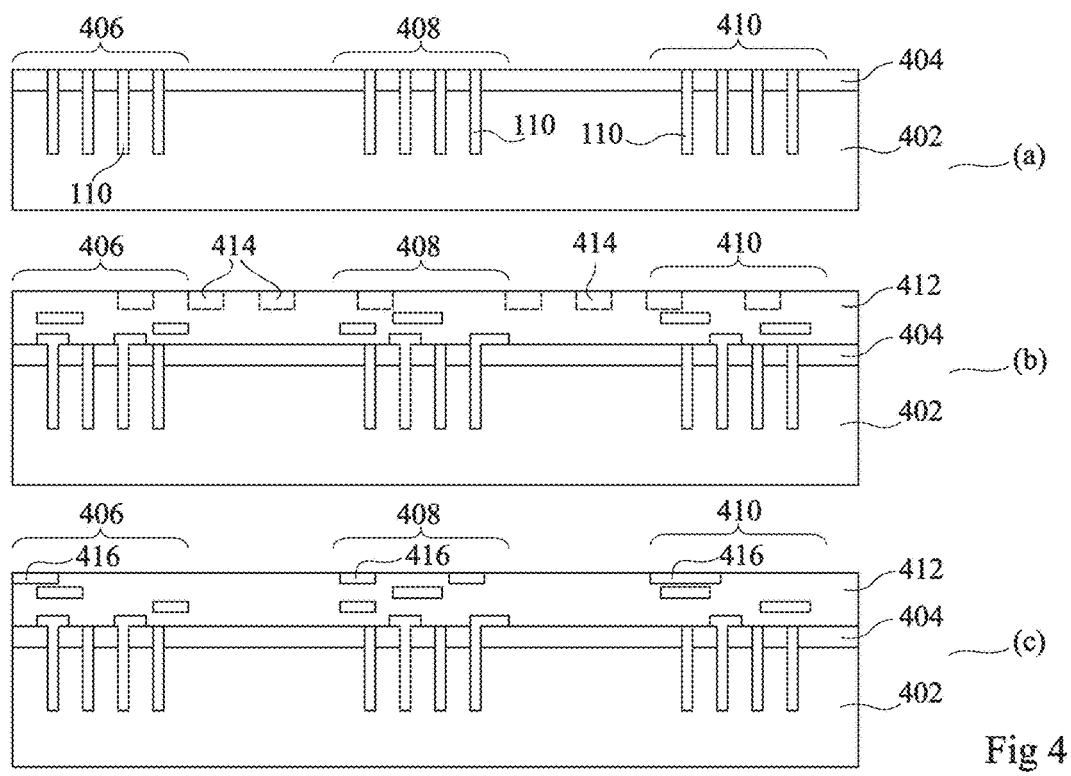
FIG. 4 shows cross-section views of a portion of a macro wafer during its fabrications according to an example embodiment of the present disclosure.

FIG. 4 shows cross-section views of a portion of a macro wafer during fabrication of macro chips or tiers of a 3D circuit according to an example embodiment of the present disclosure.

As represented in a first view (a) of FIG. 4, the macro wafer is for example fabricated using a silicon substrate 402 on which a transistor layer 404 is formed, and the TSVs 110 are also formed down from the surface of the transistor layer 404 but only partially traversing the silicon substrate 402. The example of FIG. 4 represents the formation of three adjacent macro chips or tiers 406, 408 and 410 in a portion of the wafer.

As represented in a second view (b) of FIG. 4, a metal layer 412 is then for example formed over the wafer, comprising metal levels connecting with nodes of the transistors in the transistor layer 404, and with the TSVs 110. In some embodiments, test pads 414 are formed at this stage, exposed on the surface of the metal layer 412. These test pads are for example connected to at least some of the transistors of the devices, and permit a wafer level testing of the macro circuits.

As represented in a third view (c) of FIG. 4, a copper bonding layer is then for example added to the metal layer 412, this copper bonding layer comprising interconnection pads 416, for example formed of copper, and exposed on the surface of the metal layer 412 to permit electrical bonding with the logic circuits. In some embodiments, prior to forming the copper bonding layer, the test pads 414 are removed, for example using a CMP (chemical-mechanical polishing) step.

Figure 5:
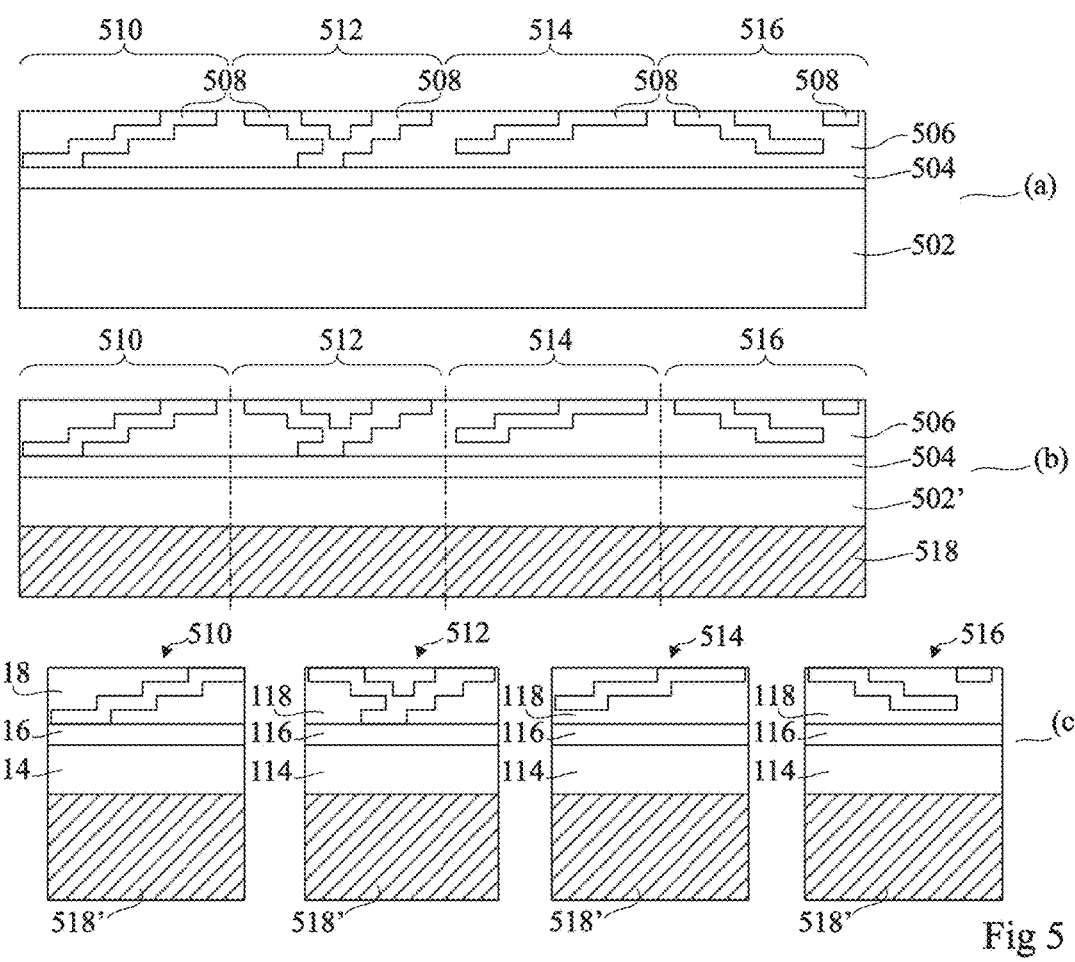
FIG. 5 shows cross-section views of a logic wafer during the fabrication of logic chips according to an example embodiment of the present disclosure.

FIG. 5 shows cross-section views of a portion of a logic wafer during the fabrication of logic chips according to an example embodiment of the present disclosure.

As represented in a first view (a) of FIG. 5, the logic wafer is for example fabricated using a silicon substrate 502 on which a transistor layer 504 is formed, and a metal layer 506 is formed over the transistor layer 504. The metal layer 506 for example comprises interconnection pads 508, for example formed of copper, that provide a copper bonding layer for connection with the interconnection pads 416 of the macros. The example of FIG. 5 represents the formation of four adjacent logic chips 510, 512, 514 and 516 in a portion of the wafer. While not represented in FIG. 5, during the formation of the metal layer 506, test pads could be formed and removed permitting the testing of the logic circuits in a similar manner to the test pads 414 of the macro wafer described above.

As represented in a second view (b) of FIG. 5, the silicon substrate 502 is for example thinned, leaving a relatively thin layer 502' of silicon of for example around 200 µm in thickness, and a handle wafer 518 may be added. Alternatively, the thinning could be performed after assembly.

As represented in a third view (c) FIG. 5, dicing is then for example performed to separate the wafer into the individual chips 510, 512, 514 and 516, in which the cut portions of the layers 502', 504 and 506 respectively form the substrate 114, transistor layer 116 and metal layer 118 of the logic chips. The handle wafer 518 for example becomes a handle layer 518' on each chip.

Figure 6:
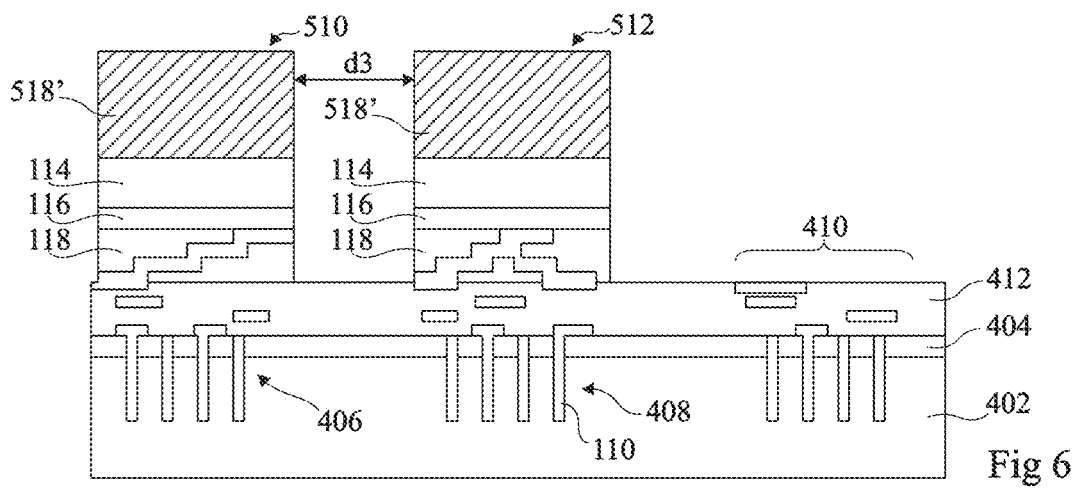
FIG. 6 is a cross-section view of an assembly operation of the logic chips of FIG. 5 on the wafer of FIG. 4 according to an example embodiment of the present disclosure.

FIG. 6 is a cross-section view of the assembly of logic circuits of FIG. 5 with the wafer of FIG. 4.

Functional logic chips (i.e. known good dies) are for example bonded to functional macro circuits (i.e. known good dies) on the macro wafer. In the example of FIG. 6, the logic chips 510 and 512 are bonded to the macro chips 406 and 408 respectively. For example, a pick and place operation is implemented to position the chips 510 and 512 face-to-face on the macro wafer over the corresponding macro chips 406 and 408. Bonding is then for example achieved using low temperature annealing. The distance d3 separating the logic chips on the macro wafer is for example between 100 µm and 500 µm, in order to ensure mechanical integrity and avoid the use of an underfill. For example, the choice of the distance d3 depends on the pick and place equipment used to place the logic chips 510, 512 on the macro wafer. This equipment may include a tool that takes the die using the left and right borders, implying a relatively large distance d3, or using only the backside, implying a relatively small distance d3. Depending on the distance d3, a material such as a polymer may be used to fill the gaps between the logic dies in order to ensure mechanical integrity during subsequent wafer thinning or other backside processes.

In the example of FIG. 6, the macro chip 410 has been found to have one or more defects, and therefore no logic circuit is assembled on this macro chip.

Figure 7:
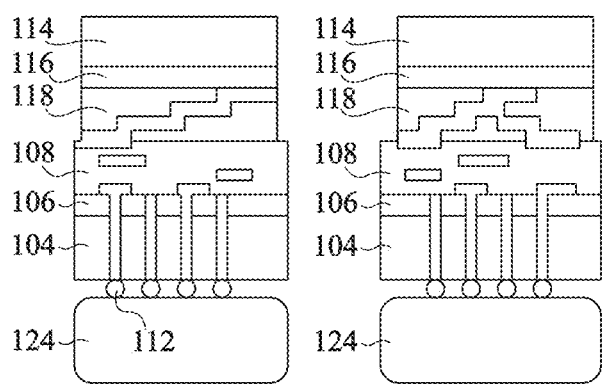
FIG. 7 is a cross-section view of 3D circuits resulting from the operations of FIGS. 4 to 6.

FIG. 7 represents 3D circuits after thinning of the substrate 402 to expose the TSVs 110, removal of the handle layers 518', the addition of micro bumps 112 and dicing of the macro wafer of FIG. 6. Furthermore, the 3D circuit has been mounted on the BGA grid package 124.

Figure 8:
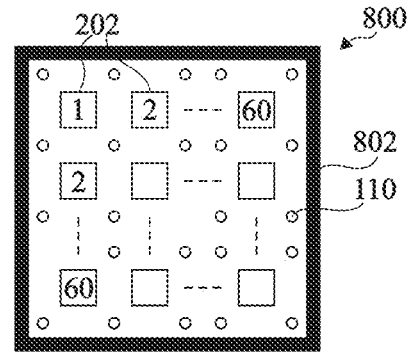
FIG. 8 is a plan view of a macro circuit according to an example embodiment of the present disclosure.

FIG. 8 is a plan view of a macro circuit 800 according to an example embodiment. The macro circuit 800 for example comprises an array of macro cells 202, and a sealring 802 surrounding the array of macro cells. The sealring for example prevents delamination of the chip during dicing. In the example of FIG. 8, the array of macro cells is a 60 by 60 array, although other dimensions would be possible.

The macro circuit 800 for example has dimensions of around 1 cm by 1 cm, and thus a surface area of around 1 cm², although other dimensions would be possible. More generally, the surface area or each macro circuit 800 is for example of between 0.2 cm² and 8 cm², or up to the size of the reticle used for fabrication. In the case that the macro circuit 800 corresponds to a memory array, such as an SRAM, each macro cell 202 for example has a storage capacity of around 100 Kbits, and thus the 60 by 60 array for example has a storage capacity of around 360 Mbits.

As mentioned above in relation with FIG. 2, the chip 101 of the 3D circuit 100 of FIG. 1 may comprise one or more macro circuits, as will now be described in more detail with reference to FIG. 9.

Figure 9:
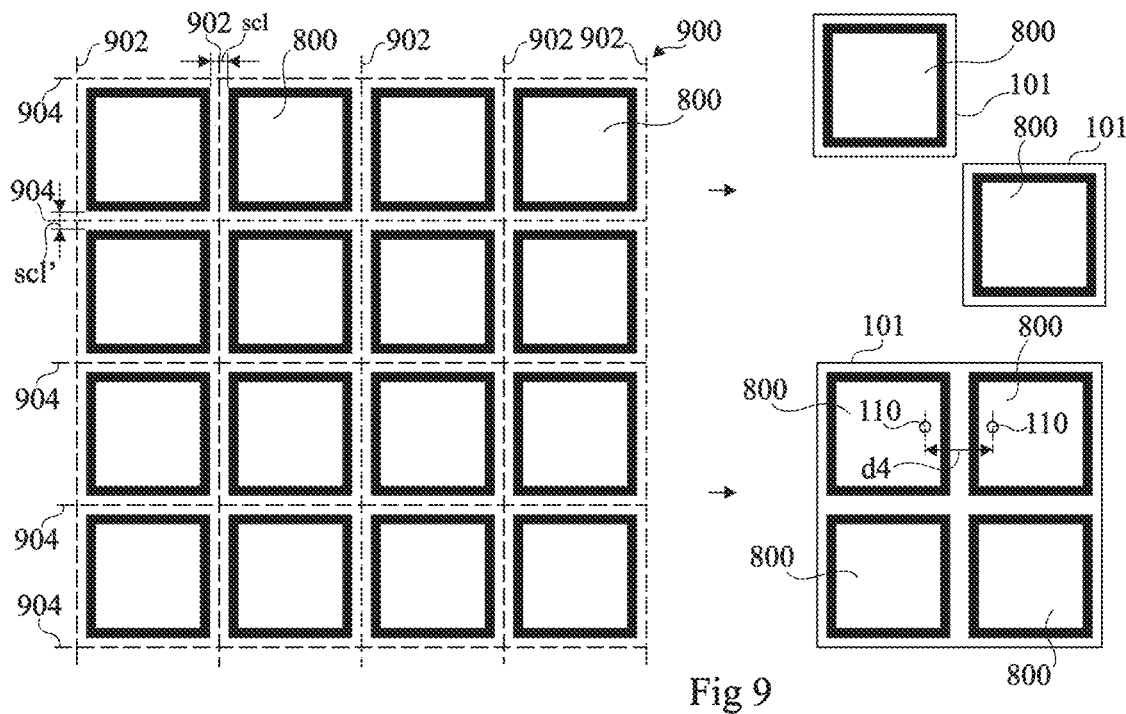
FIG. 9 is a plan view of a macro wafer prior to and following dicing.

FIG. 9 illustrates a portion 900 of a wafer on which macro circuits 800 are formed in columns and rows. Each column of macro circuits 800 is for example separated by a spacing scl large enough for a cut to be performed. Vertical cut lines 902 are represented by vertical dashed lines between the columns of macro circuits in FIG. 9. Similarly, each row of macro circuits 800 is for example separated by a spacing scl' large enough for a cut to be performed. Horizontal cut lines 904 are represented by horizontal dashed lines between the rows of macro circuits in FIG. 9.

During a dicing operation, the wafer of FIG. 9 is for example cut to form the macro chips or tiers each comprising one, two, three, four or more macro circuits 800, depending on the application. FIG. 9 illustrates an example of two chips 101 each comprising a single macro circuit 800, and of a chip 101 comprising four macro circuits 800, although other sizes would be possible.

In some embodiments, the area of the chip containing the macro circuit or circuits is greater than or equal to the area of the logic circuit to be stacked on the macro chip, and the logic chip does not having any overhanging portions.

It will be noted that, in the case that the chip 101 comprises more than one macro circuit 800, there is an interruption in the regular spacing of the macro cells 202 at the border between adjacent macro circuits 800. In some embodiments, the cells 202, the spacing scl, and the TSVs 110 are arranged such that the distance d4 between adjacent TSVs 110 of adjacent macro circuits is equal to the pitch p (see FIG. 3) of the TSVs within each macro circuit 800. In other words, the width of two adjacent seal rings 802 and the spacing scl between the sealrings is substantially equal to the width of a macro cell 202. For example, each sealring has a width of around 30 μm and the spacing scl of the dicing line is chosen to equal 90 μm, leading to a total distance of 150 μm (30+90+30), which corresponds to a pitch of the TSVs of 150 μm.

In the case that the TSV pitch within each macro circuit 800 is relatively small, for example less than 100 μm, the distance d4 between adjacent TSVs 110 of adjacent macro circuits could be a multiple of this pitch, for example two or three times the pitch. This implies that there would simply be one or more missing columns or rows of TSVs between adjacent macro circuits in the otherwise regular TSV matrix.

It is considered in the above that the designer of the macro circuits is capable of applying a regular pitch to the TSVs within each macro circuit. For example, the IO (Input/ Output) pads of the macro circuits, which for example comprise buffers and/or ESD (Electro-Static Discharge) protection, are for example positioned around the macro cells or between the macro cuts, such that a regular TSV pitch can be maintained.

Alternatively, there may be a discontinuity in the pitch between the TSVs at the border between adjacent macro circuits 800, and/or within each macro circuit.

In any case, files defining the layout of the macro chip 101 and of the macro cells on this chip for example indicate to a designer of the logic circuit the positions of the TSVs having a regular or irregular pitch.

Figure 10:
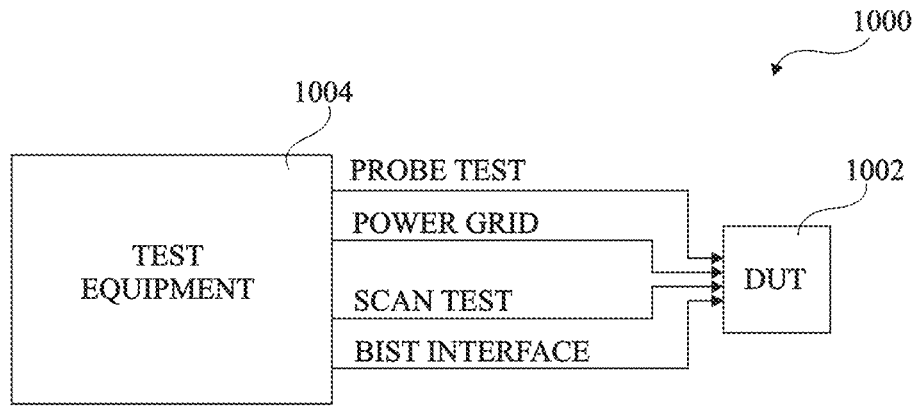
FIG. 10 schematically illustrates a test system according to an example embodiment of the present disclosure.

FIG. 10 schematically illustrates a testing system 1000 for testing a device-under-test (DUT) 1002, which is for example the macro circuit 800 or logic circuit described herein. The testing is for example at least partially performed on the individual dies at the wafer level before dicing, such that EWS (Electrical Wafer Sorting) may be performed and only known good dies are subsequently assembled.

The system 1000 for example comprises test equipment (TEST EQUIPMENT) 1004 capable of testing the DUT 1002 over a number of different test interfaces. For example, the test equipment may include a probe test (PROBE TEST), involving the use of one or more probes to make electrical contact with one or more test pads formed on a surface of the circuits to be tested, as described above. During this test, the test equipment may additionally have access to the power grids (POWER GRID) of the circuit, such that the individual dies on the circuit can be powered during the test. The test equipment may also be capable of performing a scan test (SCAN TEST) of the DUT 1004 via a test access mechanism (TAM) using a TAM protocol such as the JTAG standard IEEE 1500. A BIST circuit may also be present in the macro circuits and/or logic circuits, and the test equipment may be capable of accessing this BIST circuit via an appropriate interface.

Figure 11:
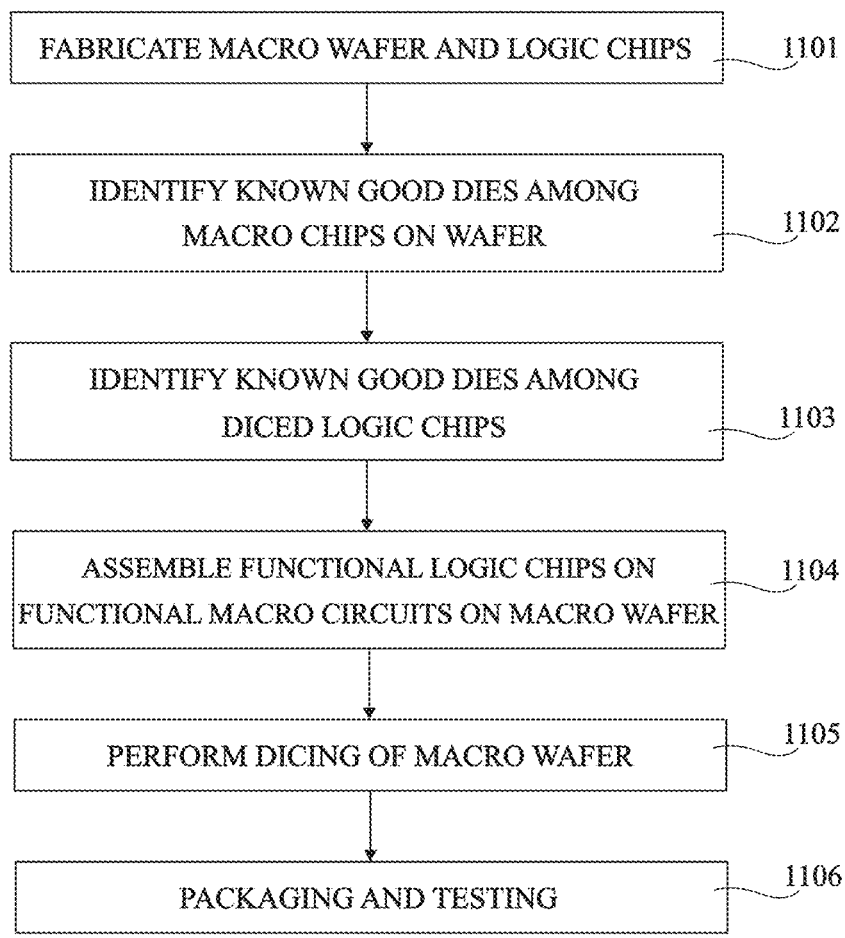
FIG. 11 is a flow diagram representing operations in a method of fabricating a 3D circuit according to an example embodiment of the present disclosure.

FIG. 11 is a flow diagram illustrating an example of operations in a method of fabricating a 3D circuit according to an example embodiment of the present disclosure. In an operation 1101, a macro wafer comprising macro circuits, and a plurality of logic chips, are fabricated. For example, as described above, fabricating the macro wafer involves forming one or more macro circuits on the wafer, each macro circuit comprising a plurality of macro cells arranged in an array, the macro cells being separated from each other by spaces; and forming interconnection vias in the spaces between the macro cells. Furthermore, fabricating the macro wafer may involve forming one or more test pads on a surface of each macro circuit.

In an operation 1102, known good dies are identified among the macro circuits on the wafer. For example, this may involve testing each macro circuit via the one or more test pads using test equipment to identify functional macro circuits. As described above with reference to FIG. 5, testing is for example performed using test pads in the metal layer before the last steps of the process that defines the bonding pads and the final planarization. This has the advantage of avoiding, in the final chip, surface degradation resulting from the testing process. The wafer level testing could be performed in a clean room at the fabrication site or foundry. Alternatively, the wafer could be shipped to another site for testing, and then returned to the fabrication site or foundry so that the bonding layer can be added and the final planarization performed.

In an operation 1103, known good dies are identified among the logic chips. This may involve performing wafer level tests in a similar manner to those performed on the macro wafer, for example using test structures formed in areas of the logic wafer that will be removed during dicing. Additionally or alternatively, this may involve testing the diced logic chips. The thermal dissipation layer 122 is for example added before or after dicing of the logic chips.

In an operation 1104, functional logic chips (known good dies) are assembled on functional macro circuits (known good dies) on the macro wafer. This for example involves selecting one or more macro circuits to form a tier of a 3D circuit from among the functional macro circuits. For example, the functional logic chips are cleaned and placed in a holder or cassette. These functional logic chips are then positioned face-to-face on the functional macro circuits of the macro wafer, and bonded at low temperature using low temperature annealing, for example at less than 500° C. In some embodiments, the bonding process is a two-step process involving bonding at ambient temperature, and then annealing at around 400° C. Furthermore, thermo-compression may be employed, involving applying pressure to the top chip during at least some of the bonding process.

In an operation 1105, dicing of the macro wafer is for example performed in order to separate the 3D circuits. Prior to dicing, the macro circuits are for example thinned to reveal the TSVs, and the micro bumps 112 of FIG. 1 are added.

In an operation 1106, each 3D circuit is then for example packaged, and further testing may be performed, for example of the 3D interfaces.

An advantage of the method described above is that testing of both the macro chips and logic chips is possible prior to assembly, and thus 3D circuits can be assembled using only known good dies. This leads to a cost reduction with respect to a 2D circuit of corresponding area.

Having thus described at least one illustrative embodiment, various alterations, modifications and improvements will readily occur to those skilled in the art. For example, it will be apparent to those skilled in the art that while examples have been provided in which the macro circuits correspond to memory arrays, other types of circuits would be possible, including analog circuits. Furthermore, it will be apparent to those skilled in the art that the logic chip 102 described herein could include one or more macros.

Furthermore, it will be apparent to those skilled in the art that the various features described in relation with the various embodiments could be combined, in alternative embodiments, in any combination.

The invention claimed is:

1. A wafer comprising:
a plurality of macro chips arranged in columns and rows and separated by dicing lines, each macro chip being suitable for forming a tier of a 3D circuit and comprising:
a stack formed of a semiconductor substrate, a transistor layer comprising transistors formed in and on the substrate, and a metal layer comprising metal levels insulated by a dielectric material, wherein one or more macro circuits are implemented in the stack, each macro circuit comprising a plurality of macro cells arranged in an array, the macro cells being separated from each other by spaces;
interconnection vias positioned in the spaces between the macro cells, the interconnection vias extending through the substrate, through the transistor layer, and at least partially through the metal layer; and
input/output pads of the macro circuits, each input/output pad performing at most the functions of electro-static discharge protection and buffering;
wherein each macro circuit further comprises one or more test circuits, and one or more test pads positioned on the face of the macro chip and permitting the functionality of the macro circuit to be tested.

2. The wafer of claim 1, wherein one or more of the interconnection vias extend through the metal layer to a corresponding interconnection pad formed on the surface of the metal layer for interconnecting with a second tier.

3. The wafer of claim 1, wherein the interconnection vias are positioned at regular intervals.

4. The wafer of claim 1, further comprising micro bumps positioned on one side of the substrate, each of the interconnection vias being connected to a corresponding one of the micro bumps.

5. A test system for testing the macro circuits of the wafer according to claim 1, the test system comprising a device under test comprising said wafer, and test equipment coupled to the one or more test pads via one or more test probes.

6. A 3D circuit formed of only two tiers stacked face-to-face, comprising:
a first tier of the two tiers comprises:
a stack formed of a semiconductor substrate, a transistor layer comprising transistors formed in and on the substrate, and a metal layer comprising metal levels insulated by a dielectric material, wherein one or more macro circuits are implemented in the stack, each macro circuit comprising a plurality of macro cells arranged in an array, the macro cells being separated from each other by spaces, wherein each macro circuit further comprises one or more test circuits;
interconnection vias positioned in the spaces between the macro cells, the interconnection vias extending through the substrate, through the transistor layer, and at least partially through the metal layer;
input/output pads of the macro circuits, each input/output pad performing at most the functions of electro-static discharge protection and buffering; and
micro bumps positioned on one side of the substrate, each of the interconnection vias being connected to a corresponding one of the micro bumps for connecting the interconnection vias to a package substrate; and
a second tier of the two tiers is stacked on the first tier and comprises a logic circuit connected via interconnection pads to the one or more macro circuits of the first tier.

7. The 3D circuit of claim 6, wherein at least a first one of the interconnection vias is coupled to a supply voltage rail of the first tier for supplying a supply voltage to the first tier, and/or at least a second one of the interconnection vias is coupled to a supply voltage rail of the second tier for supplying a supply voltage to the second tier.

8. The 3D circuit of claim 6, wherein the logic circuit is connected to the interconnection vias of the first tier via metal connections formed in a metal layer of the first tier.

9. The 3D circuit of claim 6, wherein the first tier comprises transistors fabricated using a first transistor technology, and the second tier comprises transistors fabricated using a second transistor technology different to the first transistor technology.

10. A method of fabricating a 3D circuit formed of only two tiers stacked face-to-face, the method comprising:
forming a first tier of the two tiers by:
forming one or more macro circuits, each macro circuit comprising a plurality of macro cells arranged in an array, the macro cells being separated from each other by spaces, the macro circuits being formed in a stack formed of a semiconductor substrate, a transistor layer comprising transistors formed in and on the substrate, and a metal layer comprising metal levels insulated by a dielectric material, wherein each macro circuit further comprises one or more test circuits; and forming interconnection vias in the spaces between the macro cells, the interconnection vias extending through the substrate, through the transistor layer, and at least partially through the metal layer;

forming input/output pads of the macro circuits, each input/output pad performing at most the functions of electro-static discharge protection and buffering; and forming micro bumps positioned on one side of the substrate, each of the interconnection vias being connected to a corresponding one of the micro bumps for connecting the interconnection vias to a package substrate; and forming a second tier of the two tiers, wherein the second tier is stacked on the first tier and comprises a logic circuit connected via interconnection pads to the one or more macro circuits of the first tier.

11. The method of claim 10, further comprising:
forming one or more test pads on a surface of each macro circuit corresponding to the face of the first tier; and
testing, using test equipment, each macro circuit via the one or more test pads, and using one or more test circuits of each macro circuit, to identify functional macro circuits.

12. The method of claim 11 further comprising
stacking the second tier on the first tier only if the first tier is found to be functional.

13. The method of claim 11, wherein forming the first tier further comprises removing the test pads and forming interconnection pads on the face of the first tier.

14. The method of claim 10, wherein the one or more macro circuits are formed on a wafer along with further macro circuits, the method further comprising:
selecting the one or more macro circuits to form the tier of the 3D circuit from among the functional macro circuits; and
performing dicing to separate the one or more macro circuits from the wafer.

* * * * *